United States Patent
Oppold et al.

(10) Patent No.: US 7,117,428 B2
(45) Date of Patent: Oct. 3, 2006

(54) REDUNDANCY REGISTER ARCHITECTURE FOR SOFT-ERROR TOLERANCE AND METHODS OF MAKING THE SAME

(75) Inventors: Jeffrey H Oppold, Richmond, VT (US); Michael R Ouellette, Westford, VT (US); Larry Wissell, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/270,411

(22) Filed: Nov. 8, 2005

(65) Prior Publication Data

US 2006/0059393 A1 Mar. 16, 2006

Related U.S. Application Data

(62) Division of application No. 10/249,574, filed on Apr. 21, 2003, now Pat. No. 7,000,155.

(51) Int. Cl.
*H03M 13/00* (2006.01)
*G11C 29/00* (2006.01)

(52) U.S. Cl. ...................... 714/800; 714/758
(58) Field of Classification Search ............... None
See application file for complete search history.

(56) References Cited

U.S. PATENT DOCUMENTS

| | | | |
|---|---|---|---|
| 4,360,915 A | 11/1982 | Sindelar | |
| 4,360,917 A | 11/1982 | Sindelar et al. | |
| 4,479,214 A | 10/1984 | Ryan | |
| 5,005,158 A | 4/1991 | McClure et al. | |
| 5,163,023 A | 11/1992 | Ferris et al. | |
| 5,369,650 A * | 11/1994 | Kirk et al. | 714/765 |
| 5,469,390 A | 11/1995 | Sasaki et al. | |
| 5,513,144 A | 4/1996 | O'Toole | |
| 5,644,583 A | 7/1997 | Garcia et al. | |
| 5,796,758 A * | 8/1998 | Levitan | 714/800 |
| 5,963,489 A | 10/1999 | Kirihata et al. | |
| 6,243,307 B1 | 6/2001 | Kawagoe | |
| 6,249,467 B1 | 6/2001 | Pereira et al. | |
| 6,304,989 B1 | 10/2001 | Kraus et al. | |
| 6,523,143 B1 | 2/2003 | Kobayashi | |
| 6,788,106 B1 * | 9/2004 | Kwak et al. | 326/52 |

FOREIGN PATENT DOCUMENTS

JP   8031195 A   11/1998

* cited by examiner

*Primary Examiner*—Christine T. Tu
(74) *Attorney, Agent, or Firm*—DeLio & Peterson, LLC; Robert Curcio; Michael LeStrange

(57) ABSTRACT

A redundancy register architecture associated with a RAM provides for soft-error tolerance. An enable register provides soft error rate protection to the registers that contain replacement information for redundant rows and columns. The gate register determines whether a row or column replacement register contains a specific address, and parity protection to the replacement register is activated as necessitated. The register architecture is changed to make the register state a "don't care" state for the majority of the registers. A small number of registers that are critical to the redundancy system are identified and made more robust to upsets. Word-line and column-line substitution is implemented. A ripple parity scheme is implemented when parity checks are activated.

5 Claims, 6 Drawing Sheets

REDUNDANCY REGISTER ARCHITECTURE FOR SOFT-ERROR TOLERANCE AND METHODS OF MAKING THE SAME

BACKGROUND OF INVENTION

1. Field of the Invention

The present invention relates to yield enhancement schemes and techniques. More specifically, the present invention relates to soft-error detection and mitigation of redundant columns and rows within a semiconductor memory device.

2. Description of Related Art

Large-scale semiconductor memory devices have memory cells that are typically subject to hard and soft errors. A hard error results from a defect in the memory by which a cell becomes fixed in one logical state or the other. A soft error occurs when a bit of stored data changes to an incorrect value. Soft errors are data errors that may result from radiation, such as alpha particles, or from other effects. Conventional digital error correction codes have been employed to detect errors, making correctable errors detectable in semiconductor memory devices. One method of decreasing the number of rejected semiconductor memory devices has been to replace defective memory cells with spare, redundant cells that have been incorporated within the device itself. Replacement has been achieved in the prior art through the substitution of a complete row for the defective row, or a complete column for the corresponding defective column.

Generally, a memory array contains a plurality of column decoders for enabling access to columns in the array, each column decoder being associated with a respective group of columns and arranged to access one of the columns.

If a memory cell is defective, yield enhancement schemes may be employed to implement row redundancy or to bypass a defective column. A memory cell is selected by externally applying row address signals and column address signals. A row decoder responds to the input row address to select memory cells of one row for a read or write operation. A column decoder selects one column according to the input column address and further selects one memory cell out of the one row of memory cells selected according to the row address. When a memory cell is found to be defective, the memory may be reconfigured to replace the row affected or, conversely, all the cells of the affected column with a spare column.

Typically, RAMs have a set number of original rows or word lines and a plurality of spare word lines. Reconfiguration may be performed by implementing a fuse element associated with each spare word line in a main memory array. When a memory cell is determined to be defective, the fuses for the corresponding word line address are blown to decouple the main address decoder from the row incorporating the defective memory cell. The address of the defective row is programmed into a spare address decoder that selects a spare row of memory cells in response to subsequent read or write access operations to the defective address in the main memory array. Alternatively, one may reconfigure a memory to implement spare column replacement. Blowing fuses and letting the values of the blown fuse circuitry steer the column redundancy is one means of accomplishing this. For example, some systems reroute the defective column's column enable line to the spare column. Address reordering schemes are well known and have been used often in the art.

In U.S. Pat. No. 6,249,467 issued to Pereira, et al., entitled "ROW REDUNDANCY IN A CONTENT ADDRESSABLE MEMORY," a content addressable memory (CAM) device allows defective rows in one CAM block to be functionally replaced by spare rows from any CAM block in the device. Each spare row is used to functionally replace a defective row in the same CAM block or any other CAM block by programming the address of the defective row into the corresponding spare address decoder.

In U.S. Pat. No. 5,963,489 issued to Kirihata, et al., entitled "METHOD AND APPARATUS FOR REDUNDANCY WORD LINE REPLACEMENT IN A REPAIRABLE SEMICONDUCTOR MEMORY DEVICE," a row redundancy replacement arrangement is provided wherein a word line selector circuit and redundancy controlled logic and address inputs allow the redundant true (complement) word lines to replace the normal true (complement) word lines when making a repair.

Bearing in mind the problems and deficiencies of the prior art, it is therefore an object of the present invention to provide a means to enhance reliability when a soft error upset has occurred in redundancy registers.

It is another object of the present invention to provide a soft error yield enhancement scheme to registers that contain replacement information for redundant rows and single bit slices.

A further object of the invention is to provide a circuit design to minimize soft error upset in memory devices.

Still other objects and advantages of the invention will in part be obvious and will in part be apparent from the specification.

SUMMARY OF INVENTION

The above and other objects and advantages, which will be apparent to one of skill in the art, are achieved in the present invention, which is directed to, in a first aspect, an apparatus for providing soft error protection to registers of a semiconductor memory device, the apparatus comprising: a plurality of registers individually addressable and forming a plurality of single bit slices of the memory device, each of the registers containing identifying information for redundant single bit slices; and an enable circuit for each of the single bit slices, the enable circuit electrically connected to the plurality of registers in each of the single bit slices such that when the enable circuit is inactive the plurality of registers contain logic states not relevant to the memory device operation, and when the enable circuit is active the plurality of registers identify the redundant single bit slices. The registers store data to steer memory selection away from single bit slices having defects to the redundant single bit slices. The plurality of registers in each of the single bit slices further comprise a string of stored logic states identifying at least one single bit slice substitution. The string of stored logic states comprises at least one register having a first logic state followed by at least one register having a second logic state when a substitution of the single bit slice is made, such that a change in logic states represents and identifies the single bit slice substitution. The single bit slices are combined in the memory device to form a plurality of columns, each of the columns activated by an enable circuit. Each of the enable circuits are designed to be robust to a radiation-induced soft error.

In a second aspect, the present invention is directed to an apparatus for providing soft error protection to registers of a semiconductor memory device, the apparatus comprising: a plurality of registers individually addressable and forming a plurality of word lines, each of the registers containing identifying information for redundant rows; and an enable circuit for each of the word lines, the enable circuit electrically connected to the plurality of registers in each of the word line such that when the enable circuit is inactive the plurality of registers contain logic states not relevant to the memory device operation, and when the enable circuit is active the plurality of registers identifies the redundant rows, the enable circuit further adapted to be robust to a radiation-induced soft error.

In a third aspect, the present invention is directed to an apparatus for identifying soft errors in memory devices having a plurality of logic registers for steering memory selection away from single bit slices or rows having defects to spare, redundant single bit slices or rows, the apparatus comprising an electrical connection of each of the registers to a corresponding first exclusive OR logic device, each of the first exclusive OR logic device serially connected together as a string of logic devices and adapted to provide an exclusive OR logic signal output based upon a comparison of two of the registers during a parity check. The string of logic devices comprises a plurality of the registers and the first corresponding exclusive OR logic device forming individual parity stages, such that the output of each of the parity stages forms an input to corresponding second exclusive OR logic devices. The second exclusive OR logic devices are serially connected together such that a parity value for each parity stage is compared to one another.

In a fourth aspect, the present invention is directed to a method for providing yield enhancement for a semiconductor memory device comprising: providing a plurality of registers individually addressable and forming a plurality of single bit slices of the memory device; storing identifying information for redundant single bit slices in each of the registers; providing an enable circuit for each of the single bit slices; connecting the enable circuit to the plurality of registers in each of the single bit slices; designating the enable circuit inactive when the plurality of registers are not in use, such that logic states of the registers are not relevant to the memory device operation; and designating the enable circuit active when the plurality of registers identifies the redundant single bit slices.

In a fifth aspect, the present invention is directed to a method of performing yield enhancement in memory devices having a plurality of logic registers for steering memory selection away from single bit slices or rows having defects to spare, redundant single bit slices or rows, the method comprising: electrically connecting each of the registers to a corresponding first exclusive OR logic device having inputs and an output; serially connecting each of the first exclusive OR logic devices together as a string of logic devices and adapted to provide an exclusive OR logic signal output based upon a comparison of two of the registers; connecting a plurality of the string of logic devices to a corresponding second exclusive OR logic devices; and performing a parity check of the registers by comparing logic states of the second exclusive OR logic devices.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
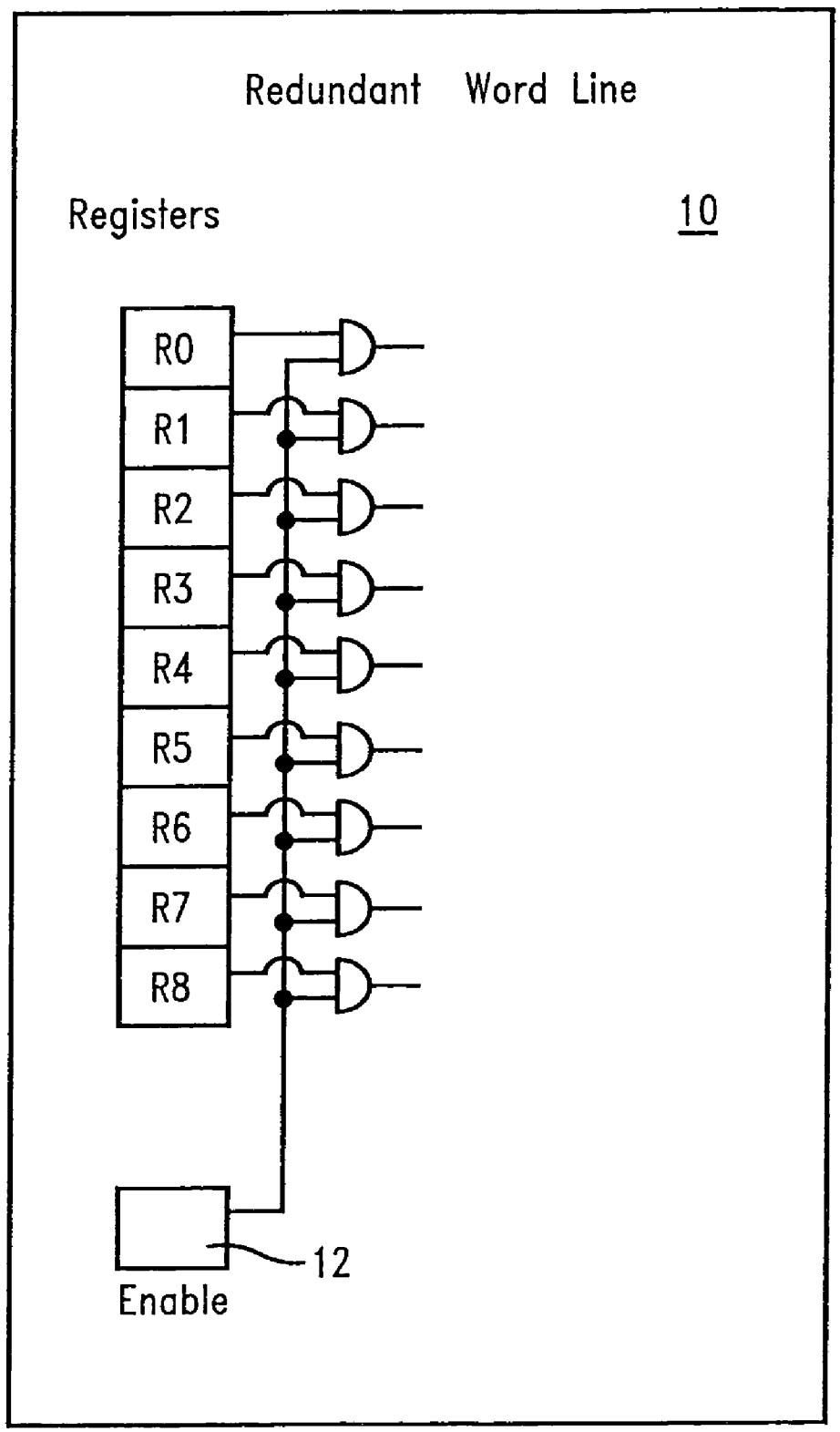
FIG. 1 illustrates address registers of a redundant word line employing the concept of a single gating register or "enable" circuit.

In describing the preferred embodiment of the present invention, reference will be made herein to FIGS. 1–6 of the drawings in which like numerals refer to like features of the invention. Features of the invention are not necessarily shown to scale in the drawings. Although specific memory sizes may be designated for illustrative purposes, the present invention is not directed to any one specific memory device or size, and may be implemented on memory devices of varying sizes and complexity.

A random access memory (RAM) with redundant rows and columns contains a large number of registers dedicated to long-term storage of the addresses of rows and columns that are replaced by the redundant rows and columns. These addresses are generated at power-on by redundancy fuse macro circuitry. The registers are then loaded with the addresses. A change to the state of one of these registers can render the RAM unusable. As discussed above, changes of state may be caused by radioactive particle induced soft errors. The present invention provides a readily available means to enhance the memory device reliability when a soft error upset has occurred in one of these registers. Approaches are introduced to observe and mitigate these errors.

One approach requires an architecture change made to a memory device, such as a RAM, wherein a new register state or status is incorporated. A "don't care" state is accepted for an overwhelming majority of the registers. During this state, no activity is performed after an upset to a register. The new register status is accomplished, in part, by recognizing that redundancy is not implemented on most rows and columns. As such, the registers for these rows and columns are not programmed to implement redundancy. An upset in any one of these N registers would cause an error in the redundancy implementation. The present invention introduces architecture that provides for a single gating register for the N row address registers. In a majority of situations, the address registers will not be programmed, and their values may be controlled by the single gating register, such that an upset to any of the individual address registers is designated a "don't care" condition or state. By incorporating a single gating register, the probability of an upset to the gate register is N times less than the probability of an upset to any of the N+1 address registers.

FIG. 1 illustrates a redundant word line 10 of the instant invention employing the concept of a single gating register or "enable" circuit 12. In this example, registers R0 through R8 are serially connected to the enable circuit 12. Although only nine registers are shown, this redundant word line may consist of significantly more registers, depending upon the device architecture and topology. These registers store the address for which this word line is to be substituted, such that in each spare word line there is a register dedicated to each word line address bit. The enable circuit 12, when activated, enables a comparator circuit to compare incoming addresses. If the redundant word line has not been utilized, the enable circuit 12 would be inactive or zero. When the enable circuit 12 is inactive, the state of the registers R0 through R8 are designated "don't care" since an upset to these registers does not affect system operation as long as the spare word line is not enabled. The "don't care" register status-signifies that the registers of the inactive word line are immaterial to the device operation. Consequently, by utilizing each active gate enable circuit 12 for each associated word line, a reduction in the probability of soft error upset is realized since the number of chances for upsets is significantly reduced. To effectuate the row redundancy yield enhancement scheme, the address of a defective word line is programmed into the registers of a spare word line, which during operation allows the original word line having a defect to be bypassed. The registers of the redundant rows, also known as the redundancy registers, represent the address bits for the redundant word lines being used.

Figure 2:
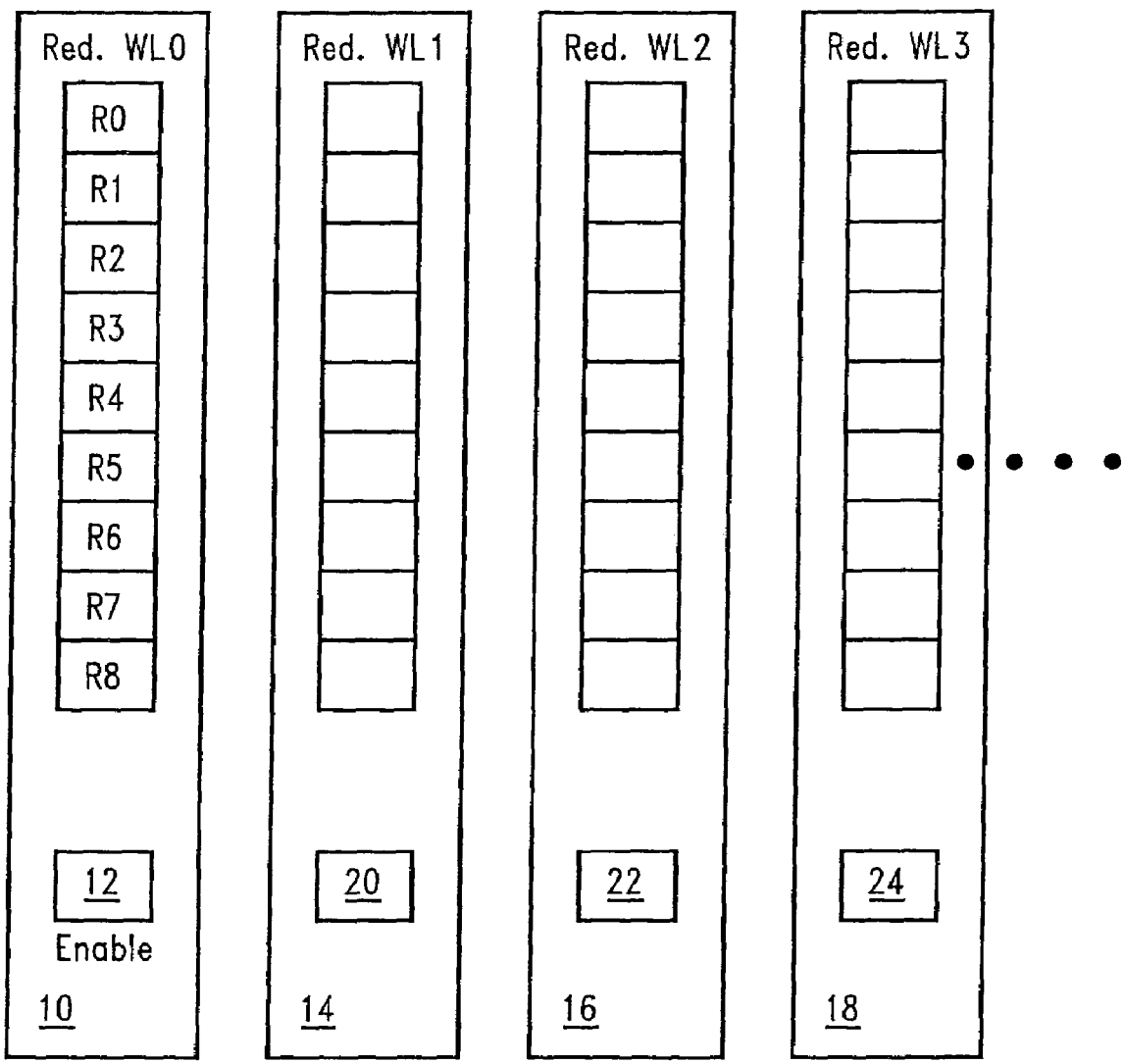
FIG. 2 is a schematic of four blocks of the redundant word line of FIG. 1, representing redundant word lines 0 through 3.

FIG. 2 depicts four redundant word line blocks, representing redundant word line 0 through redundant word line 3, as labeled by 10, 14, 16, and 18, respectively. Each word line block has an associated enable circuit 12, 20, 22 and 24, which can activate their respective registers. Additionally, the technology and design of the gating or enabling registers are chosen to be more robust to soft error upset, thereby reducing further the probability of erroneous data unknowingly being stored in registers used to select a redundant row. Hardening the gating registers to a radiation-induced soft error minimizes the need to implement radiation-hardening designs in the address registers.

Another manner of enhancing yield in memory devices is to introduce single bit slice substitution. This selection normally includes accessing single bit slices of the memory device to replace those that have been identified with a defective array element. Each single bit slice of the random access memory (RAM) contains a plurality of columns, a column multiplexor, data input circuitry, and data output circuitry. A RAM comprises many single bit slices, which include a plurality of spares and multiplexors to steer data away from those single bit slices having defects to the spare single bit slices being activated in their place. Single bit slice redundancy is implemented by replacing one single bit slice for a substitute one.

Figure 3:
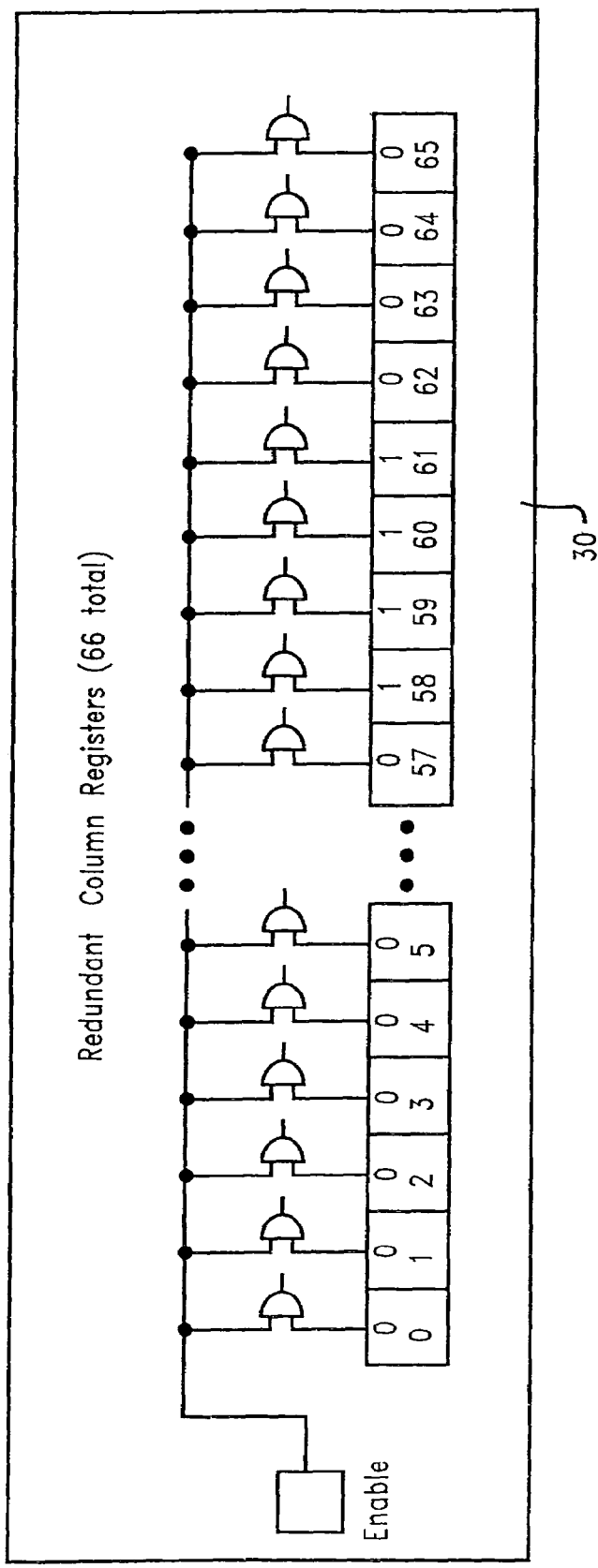
FIG. 3 is a schematic of a string of registers depicting actual values required to indicate a change in the architecture to select a redundant column.
Figure 4:
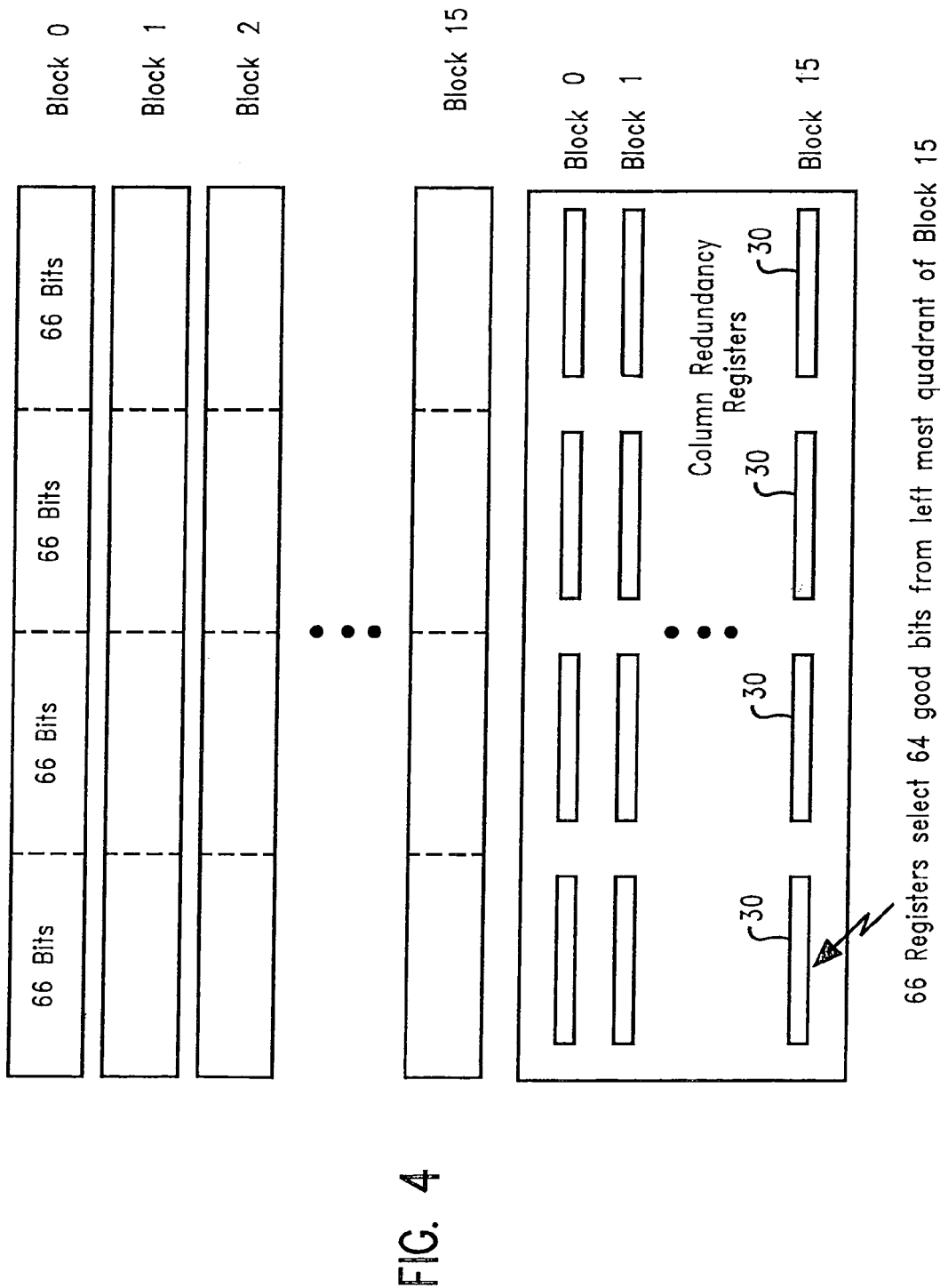
FIG. 4 is a schematic of a matrix of column redundancy registers of FIG. 3.

Single bit slice substitution may be performed in blocks. For example, two redundant single bit slices may be made available for a block of sixty-four; however, the number of blocks is relative to the memory device size and architecture, and may certainly be much larger than sixty-six (two spare blocks plus sixty-four original blocks). Additionally, an enable register is available for each of the single bit slices, including the redundant columns therein. Moreover, the number of redundant single bit slices is also somewhat arbitrary, and predetermined at the time of memory device design. A preferred way to select and designate a single bit slice for substitution is based on a change in the string of stored values in the registers. For example, if the redundant single bit slice registers have a "0" in a first group of registers, but change to a "1" in the next register, this change would indicate a substituted single bit slice has been activated for replacement. FIG. 3 depicts this example. Single bit slice 58 is shown having a logic "1" in its register after a string of logic "0s". Consequently, this single bit slice has been selected as a substitute single bit slice. Furthering this example, as depicted in FIG. 3, registers 58 through 61 all have a logic "1", but the next single bit slice register 62 reverts back to logic "0" which indicates a second redundant single bit slice substitution. If redundant single bit slices are not in use, then the registers 0–65 of FIG. 3 are designated logic "0". An unused redundancy advantage is realized by the implementation of this scheme. As shown in FIG. 3, the gating or enable register is added to the sixty-six registers used to select a redundant single bit slice. This single enable register protects all of the registers when column redundancy is not exercised. The plurality of single bit slices controlled by the registers in FIG. 3 are just a small part or block 30 of the entire RAM macro. Each block has at least four times as many single bit slices, therefore four times as many registers. In typical devices there are up to sixteen blocks. FIG. 4 depicts a 16 Mb RAM 32 having single bit slice redundancy registers. Each redundant single bit slice register block 30 of FIG. 3 is individually represented in FIG. 4, as shown.

Through the implementation of a gating or enabling register for each block of registers, the present invention provides a scheme to improve yield enhancement and minimize soft error susceptibility by introducing a "don't care" or "immaterial" status that precludes any activity based on a changed register state.

Additionally, the gating or enabling registers may be made more robust to soft error upset, thereby reducing further the probability of erroneous data unknowingly being stored in registers used to select redundant rows or single bit slices.

Figure 5:
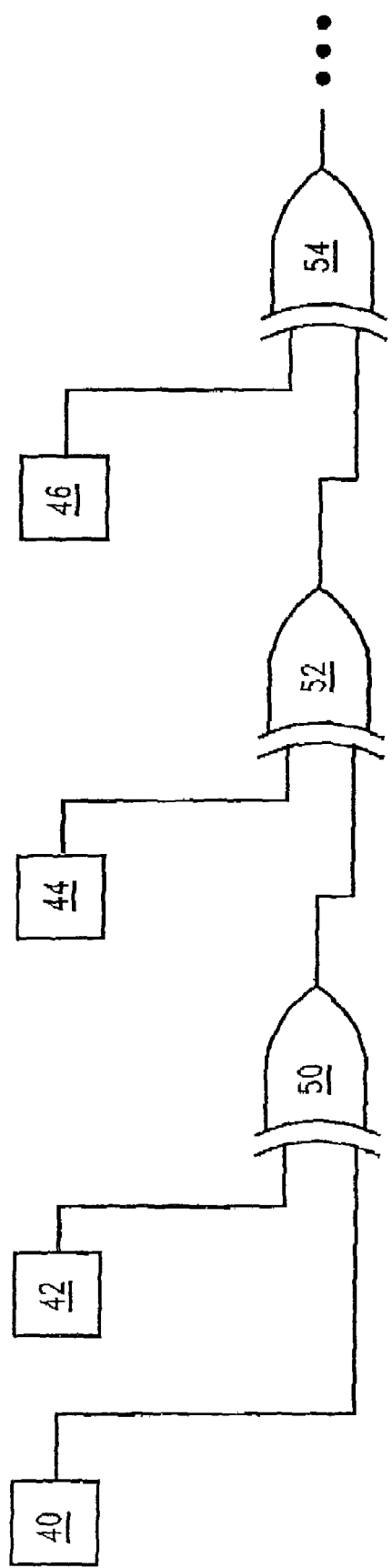
FIG. 5 depicts the logic circuitry for the ripple parity scheme as applied to four registers.
Figure 6:
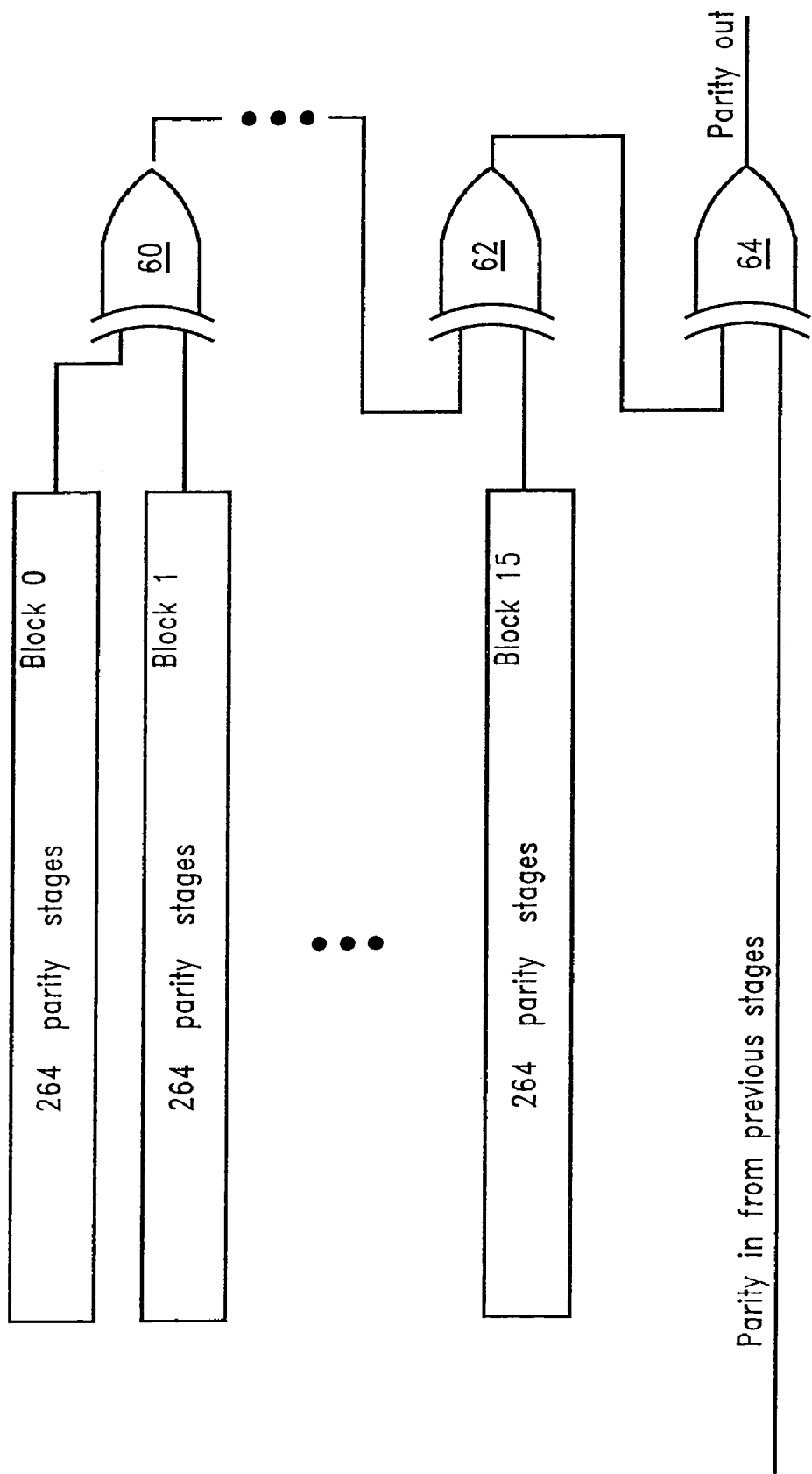
FIG. 6 depicts the serial-parallel architecture for parity checking of a register matrix.

A second approach for minimizing the adverse affects of soft-errors in memory devices considers a parity check error identification scheme. Each memory device comprises a large number of registers, typically an array of 16×264 for column redundancy alone. Consequently, traditional error control logic with extra bits and exclusive OR (XOR) logic trees is not efficiently feasible. The present invention introduces a "ripple parity" scheme, which promises a greatly reduced overhead of device circuitry. FIG. 5 depicts the logic circuitry for the ripple parity scheme as applied to four registers 40, 42, 44 and 46. The digital circuitry overhead is N−1 XOR gates for N registers. As depicted, XOR gates 50, 52, and 54 illustrate the digital ripple effect of the parity check for this architecture. This design allows the parity to be rippled for as many registers as desired. For example, parity for the column redundancy register block of FIG. 4 may begin at the left quadrant of Block 0 and ripple across all 264 registers of Block 0. It would then ripple through the 264 registers of Block 1, and all other blocks sequentially before finally exiting at the end the Block 15 registers. The total number of ripple stages for the architecture of FIG. 4 is calculated to be 264 stages per block times 16 blocks, or 4224 stages. This circuitry is recognizably slow due to signal propagation through so many stages. A means to improve the speed without significant overhead is to distribute the serial ripple of FIG. 5 into a serial-parallel combination scheme, where the maximum length of the serially rippled devices is significantly reduced. FIG. 6 depicts the serial-parallel architecture for parity checking of a redundant matrix. Introducing XOR logic to each parity stage, the delay associated with the architecture of FIG. 5 is reduced by a factor of 16. This is accomplished by beginning a new parity value for each row of registers belonging to a block, and then combining all rows together with 16 more XOR gates 60, 62, 64 at the end of the rows. In this example, the ripple delay of the parity of all blocks would be reduced to 266 XOR gates for each block, requiring a new scan-only register at the beginning of each block to get the correct parity started, plus the 16 XOR gates that combine all blocks.

The introduction of a serial-parallel architecture for implementing a ripple parity scheme allows for detection of soft errors through comprehensive parity checks. The architecture reduces the time to perform the checks by introducing parallel paths within the logic circuitry. These parity checks are performed when redundant rows or columns are necessitated in the device.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. An apparatus for identifying soft errors in memory devices having a plurality of logic registers for steering memory selection away from single bit slices or rows having defects to spare, redundant single bit slices or rows, said apparatus comprising an electrical connection of each of said registers to a corresponding exclusive OR logic device, each of said corresponding exclusive OR logic devices serially connected together as a string of logic devices, providing an exclusive OR logic device signal output to a next sequential exclusive OR logic device input based upon a comparison of preceding sequential register output and a preceding exclusive OR logic device output during a parity check, and further including having an initial exclusive OR logic device with a register output for each input.

2. The apparatus of claim 1 wherein said string of logic devices comprises a plurality of said registers and said corresponding exclusive OR logic devices forming individual parity stages, such that the output of each of said parity stages forms an input to a sequentially corresponding second exclusive OR logic device.

3. The apparatus of claim 2 wherein said second exclusive OR logic devices are serially connected together such that a parity value for each parity stage is compared to one another.

4. The apparatus of claim 2 further comprising a scan-only register for each parity stage to initiate an initially correct parity.

5. A method of performing yield enhancement in memory devices having a plurality of logic registers for steering memory selection away from single bit slices or rows having defects to spare, redundant single bit slices or rows, said method comprising:
   electrically connecting each of said registers to a corresponding exclusive OR logic device input;
   serially connecting each of said corresponding exclusive OR logic devices together as a string of logic devices, providing an exclusive OR logic signal output based upon a comparison of said corresponding resister and a preceding exclusive OR logic device output;
   serially connecting each output of a plurality of said string of logic devices to corresponding second exclusive OR logic devices, wherein said second exclusive OR logic devices each have an exclusive OR logic signal output based upon a comparison of said output of said corresponding string of logic devices and said preceding second exclusive OR logic device output; and
   performing a parity check of said registers by comparing logic states of said second exclusive OR logic devices.

* * * * *

UNITED STATES PATENT AND TRADEMARK OFFICE
CERTIFICATE OF CORRECTION

PATENT NO.       : 7,117,428 B2
APPLICATION NO. : 11/270411
DATED            : October 3, 2006
INVENTOR(S)      : Oppold et al.

Page 1 of 1

It is certified that error appears in the above-identified patent and that said Letters Patent is hereby corrected as shown below:

On the title page:

Item (75) Inventors: Delete "Jeffrey H Oppold" and substitute therefor -- Jeffery H Oppold --

Delete " Larry Wissell" and substitute therefore -- Larry Wissel --

Signed and Sealed this

Sixth Day of November, 2007

JON W. DUDAS
*Director of the United States Patent and Trademark Office*